(12) United States Patent
Mori et al.

(10) Patent No.: US 6,401,554 B1
(45) Date of Patent: Jun. 11, 2002

(54) DEVICE FOR TESTING WAFER-TRANSPORTING ROBOT

(75) Inventors: Kunihiko Mori; Taizo Ishikura, both of Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/869,536

(22) PCT Filed: Oct. 27, 2000

(86) PCT No.: PCT/JP00/07562

§ 371 (c)(1),
(2), (4) Date: Jun. 29, 2001

(87) PCT Pub. No.: WO01/33624

PCT Pub. Date: May 10, 2001

(30) Foreign Application Priority Data

Oct. 29, 1999 (JP) .......................................... 11-308046

(51) Int. Cl.[7] ............................................... G01N 19/00
(52) U.S. Cl. ....................................... 73/865.9; 73/1.81
(58) Field of Search ............................ 73/865.8, 865.9, 73/1.79, 1.81; 356/614, 625

(56) References Cited

U.S. PATENT DOCUMENTS 5,163,334 A * 11/1992 Li et al. ..................... 73/865.9
6,175,413 B1 * 1/2001 Lucas ......................... 73/1.79
6,205,870 B1 * 3/2001 Hosokawa et al. ......... 73/865.9

FOREIGN PATENT DOCUMENTS

JP 6-298315 10/1994
JP 2001-15575 1/2001

OTHER PUBLICATIONS

International Search Report prepared by Japanese Patent Office, Feb. 2001.

* cited by examiner

*Primary Examiner*—Robot Raevis
(74) *Attorney, Agent, or Firm*—McDermott, Will & Emery

(57) ABSTRACT

An inspection apparatus for inspecting the soundness of a substrate transfer robot of a type horizontally transferring a substrate such as a semiconductor wafer mounted on a blade. The inspection apparatus is efficiently used in a multi-chamber type semiconductor manufacturing apparatus and has a noncontact type distance sensor capable of measuring a vertical distance. When the upper face of a cassette stage disposed within a load-lock chamber is assumed to be a reference surface, the distance sensor in the inspection apparatus measures the vertical distance between the horizontal reference surface and the blade of robot moving above the reference surface. From thus measured value, the warp of blade and its shaking upon movement can be detected.

9 Claims, 6 Drawing Sheets

DEVICE FOR TESTING WAFER-TRANSPORTING ROBOT

TECHNICAL FIELD

The present invention relates to a substrate processing apparatus for handling a substrate such as a liquid crystal panel or semiconductor wafer; and, in particular, to an inspection apparatus for measuring or inspecting the operating accuracy or state of a substrate transfer robot employed within the substrate processing apparatus.

BACKGROUND ART

A single-wafer-processing multi-chamber type semiconductor manufacturing apparatus comprises a transfer chamber and a plurality of process chambers disposed thereabout, and is configured such that individual semiconductor divices can be manufactured and processed in a consistent atmosphere. In such a semiconductor manufacturing apparatus, a wafer transfer robot disposed within the transfer chamber usually transfers a semiconductor wafer (hereinafter referred to as "wafer") into or out of each process chamber.

A typical conventional wafer transfer robot is constituted by a thin planar blade for horizontally holding a wafer, and an arm assembly comprising a link mechanism adapted to horizontally expand/contract and rotate while supporting this blade.

For transferring a wafer into or out of the semiconductor manufacturing apparatus without opening the inside of transfer chamber and process chamber to the outside air, a load-lock chamber is connected to the transfer chamber. A wafer cassette for accommodating a plurality of wafers at predetermined intervals in the vertical direction is set within the load-lock chamber. The wafer cassette is supported on a cassette stage in an aligning apparatus known as a cassette indexer and is vertically moved up and down. As a consequence, a selected wafer within the wafer cassette can be aligned with respect to the blade of wafer transfer robot, whereby the wafer can be accommodated and taken out.

The wafer cassette has a box shape having at least one open side face, whereas a pair of side plates opposing each other are formed-with slots for accommodating the wafers at predetermined intervals in the vertical direction. Each slot is formed so as to become parallel, e.g., usually horizontal, to the upper face of cassette stage when the wafer cassette is mounted on the cassette stage. The vertical interval between slots has such an extent that it is slightly greater than the maximum thickness of blade so as to be able to accommodate a large number of wafers, while being set such that the blade does not come into contact with the accommodated wafers when the blade is horizontally advanced so as to be inserted into the wafer cassette.

The blade of wafer transfer robot and each slot of wafer cassette, i.e., the upper face of cassette stage in the cassette indexer, should be horizontal to each other, and should be parallel to each other even if not completely horizontal. However, there are cases where the parallelism between the robot blade and the upper face of cassette stage is lost due to manufacturing errors or assembling errors in the apparatus. Therefore, a calibration operation for adjusting the degree of parallelism between the upper face of cassette stage and the robot blade to a value within a permissible range has conventionally been carried out periodically or as required.

Since the conventional calibration operation is based on visual inspection, it may yield large errors and thus cannot be carried out accurately. Since the vertical interval between the upper and lower slots is relatively narrow, there may be obstacles when taking out or accommodating wafers if an error is generated in the degree of parallelism of blade with respect to the upper face of cassette stage.

Also, depending on the state of assembly of wafer transfer robot or its state of use over a long period of time, the blade may generate sagging (downward flexure in its leading end portion), or vertical movement and sidewise rolling (collectively referred to as shaking) when linearly moved. If such "sagging" and "shaking" become too large, then the leading end of blade and the wafer may detrimentally come into contact with each other when the blade is inserted into the wafer cassette in order to take out the wafer, for example. Therefore, inspections are periodically carried out so as to determine the state of soundness of the wafer transfer robot, and maintenance operations such as adjustment and replacement of parts are carried out if the wafer transfer robot is determined defective. This inspection has conventionally been problematic in that appropriate determination cannot be carried out since it is also based on visual inspection.

Such problems similarly exist not only in multi-chamber type semiconductor manufacturing apparatus comprising a wafer transfer robot, but also in substrate transfer robots for other substrate processing apparatus for transferring a substrate such as a liquid crystal panel mounted on a blade.

In view of the circumstances mentioned above, it is an object of the present invention to provide an inspection apparatus which can accurately measure the operating accuracy or state of a substrate (wafer) transfer robot and can appropriately inspect the state of soundness of the substrate transfer robot.

DISCLOSURE OF THE INVENTION

In order to achieve the above-mentioned object, the present invention provides an apparatus for inspecting a substrate transfer robot having a substantially horizontally movable blade on which a substrate rests for transferring the substrate within a substrate processing apparatus such as a multi-chamber type semiconductor manufacturing apparatus, the inspection apparatus comprising a noncontact type distance sensor adapted to measure a vertical distance between a substantially horizontal reference surface within the substrate process chamber and the blade moving above the reference surface.

In this configuration, since the vertical position of blade with respect to a predetermined reference surface can be measured by the distance sensor, the sagging and shaking of the blade can be inspected.

Preferably, the distance sensor is attached to a holder mounted on the reference surface. As a consequence, the inspection apparatus can be taken out from the substrate processing apparatus while processing the substrate, whereby there is no need for modifying or improving the substrate processing apparatus.

If two or more distance sensors are arranged in parallel along a predetermined locus in which the blade advances linearly, then the vertical movement of blade can be verified. If three distance sensors are arranged in each of two rows parallel to each other along the predetermined locus in which the blade advances linearly, then the sidewise rolling or warp of the blade can be seen.

Preferably, the inspection apparatus in accordance with the present invention further comprises display means for displaying distance data measured by the distance sensor.

If the inspection apparatus in accordance with the present invention comprises blade position detecting means for detecting a horizontal position of the blade, then it can automatically determine the state of substrate transfer robot according to thus obtained data and the distance data measured by the distance sensor.

The substrate processing apparatus to which the present invention is applicable includes the multi-chamber type semiconductor manufacturing apparatus, i.e., one comprising a transfer chamber in which a substrate transfer robot is disposed; a process chamber connected to the transfer chamber, for processing a semiconductor wafer as the substrate; and a load-lock chamber connected to the transfer chamber and arranged with a wafer cassette for accommodating a plurality of semiconductor wafers. Preferably, in such a multi-chamber type semiconductor manufacturing apparatus, the reference surface is the upper face of a cassette stage of a cassette indexer disposed in the load-lock chamber.

The above-mentioned object and other characteristics and advantages of the present invention will be clear to those skilled in the art if they read the following detailed explanations with reference to the accompanying drawings.

BEST MODES FOR CARRYING OUT THE INVENTION

In the following, preferred embodiments of the present invention will be explained in detail with reference to the drawings.

Figure 1:
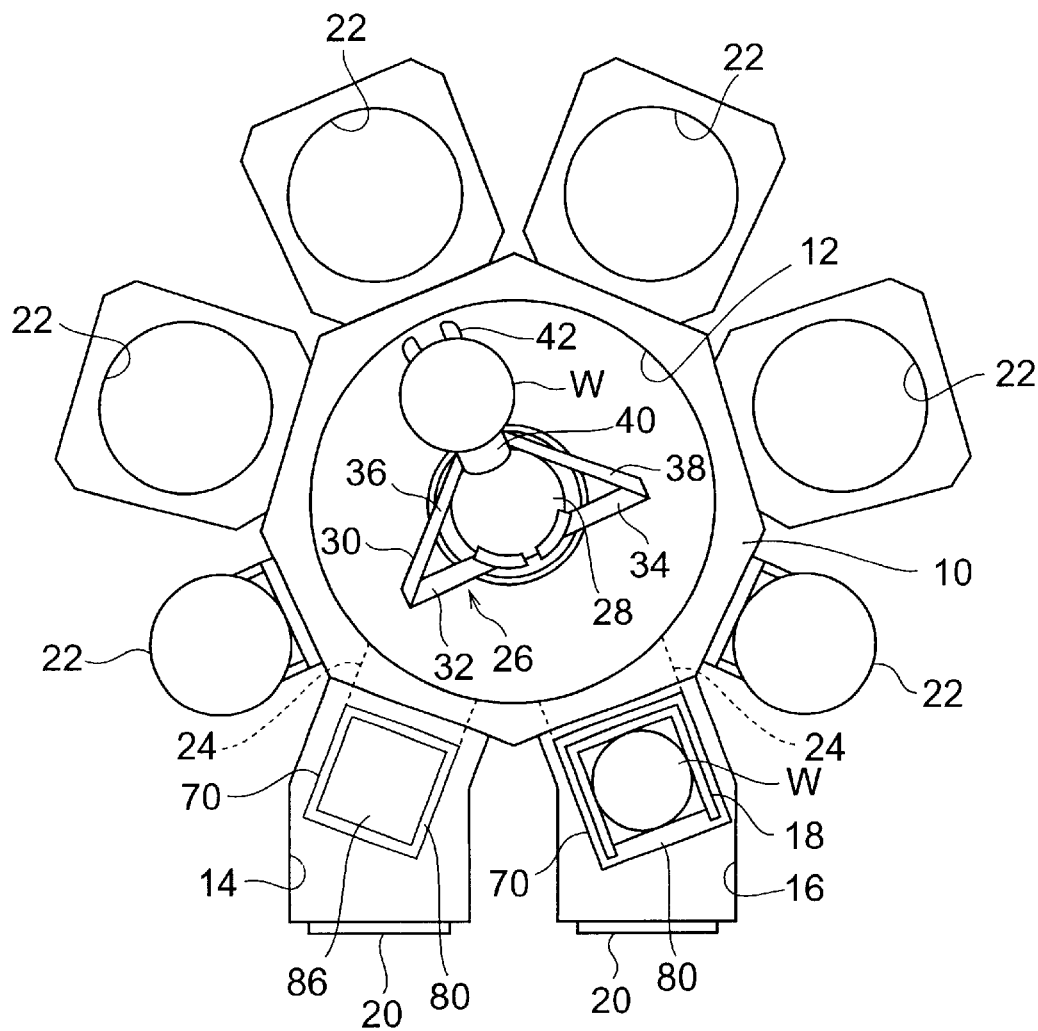
FIG. 1 is a schematic view showing a semiconductor manufacturing apparatus to which the inspection apparatus in accordance with the present invention is applicable.

FIG. 1 shows a semiconductor manufacturing apparatus to which the inspection apparatus in accordance with the present invention is applicable. This semiconductor manufacturing apparatus has been known as a single-wafer-processing multi-chamber type. In FIG. 1, numeral 10 refers to a mainframe monolith made of aluminum, within which a transfer chamber 12 is formed. One or more load-lock chambers, e.g., two load-lock chambers 14, 16 in the shown embodiment, are connected to the transfer chamber 12. Each of the load-lock chambers 14, 16 is a start or end point for transferring a semiconductor wafer W, and is configured such that a wafer cassette 18 accommodating a plurality of wafers W at predetermined intervals in the vertical direction can be set therein via a load-lock door 20 from the outside (the wafer cassette 18 is set within the chamber 16 alone in FIG. 1). Connected to the transfer chamber 12 thereabout are various process chambers 22 for carrying out film forming processing operations such as sputtering and CVD. Each of the chambers 22, 14, 16 and the transfer chamber 12 are communicated to each other via an opening 24 (shown for the chambers 14, 16 alone here), whereas each opening 24 can be opened and closed by a slit valve (not shown), whereby the inside of each chamber is held at a predetermined degree of vacuum.

Wafers are transferred between chambers by a wafer transfer robot 26 disposed within the transfer chamber 12. The wafer transfer robot 26 comprises an arm assembly 30 which is attached, so as to be horizontally rotatable and adapted to expand and contract, to a support tube 28 disposed at the center of the transfer chamber 12. The arm assembly 30 is constituted by a pair of driving arms 32, 34 rotatably attached onto the outer peripheral surface of the support tube 28, a pair of follower arms 36, 38 having respective ends axially supported at their corresponding leading ends of driving arms 32, 34, and a blade support plate 40 axially supported at the leading ends of driven arms 36, 38. A planar blade 42 for horizontally mounting the wafer W is supported by the blade support plate 40. With this arrangement, the blade 42 will horizontally move away from the support tube 28 if the driving-arms 32, 34 are rotated in directions approaching each other, whereas the blade 42 will approach the support tube 28 if the driving arms 32, 34 are rotated away from each other. If the driving arms 32, 34 are pivoted in the same direction, the blade 42 will rotate about the support tube 28. When such operations are carried out, the blade 42 can be inserted into any of the chambers 14, 16, 22 arranged about, the transfer chamber 12, whereby the wafer W can be transferred therein or therefrom.

The driving arms 32, 34 are rotated by stepping motors (not shown in FIG. 1) disposed within the support tube 28.

Figure 2:
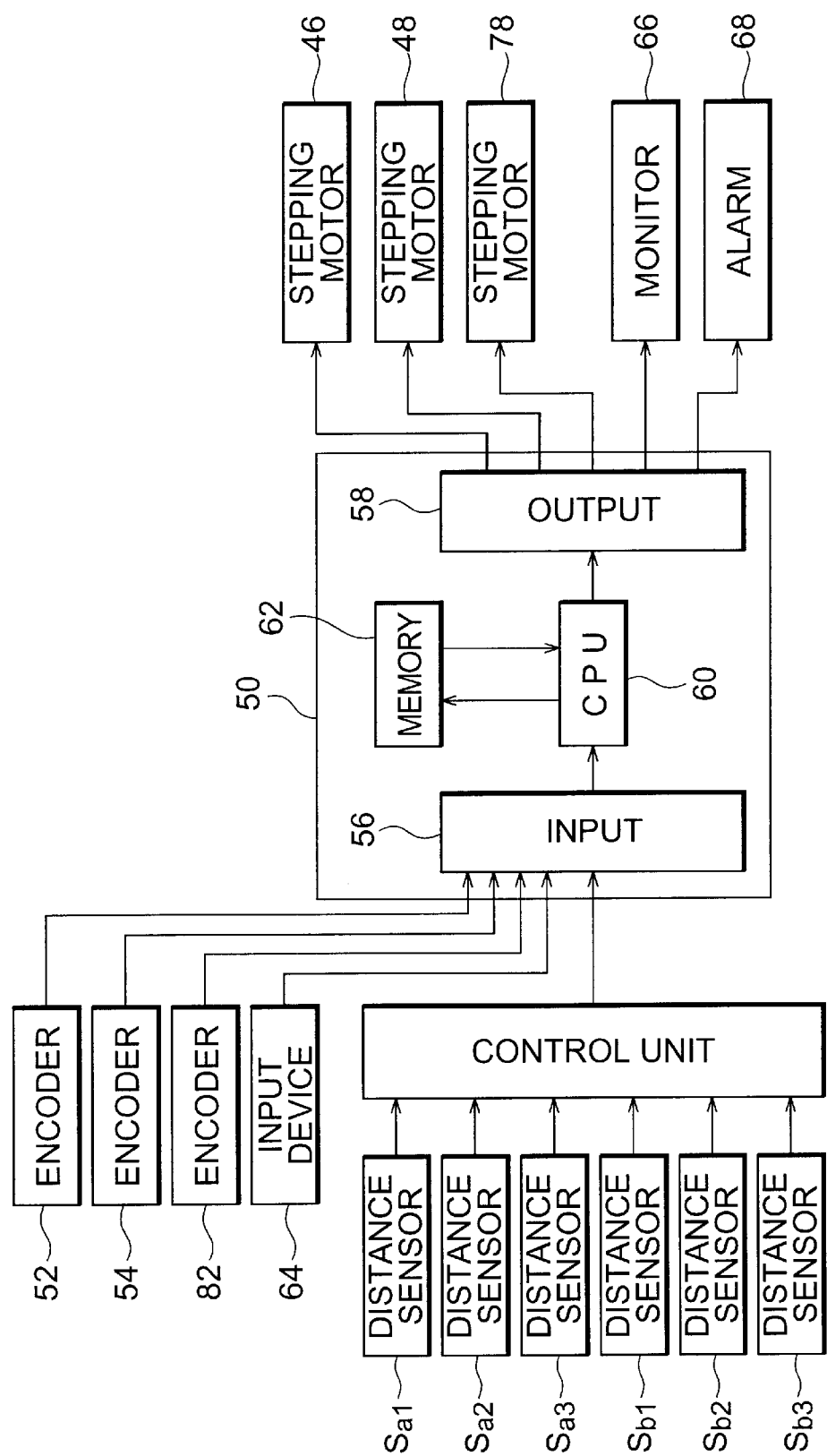
FIG. 2 is a block diagram showing the control system in the semiconductor manufacturing apparatus of FIG. 1.

The driving arms 32, 34 are provided with their respective stepping motors. As shown in FIG. 2, these stepping motors 46, 48 turn their rotary shafts in response to pulse control signals from a controller 50 so as to rotate their corresponding driving arms 32, 34 by way of magnetic couplings. Rotary encoders 52, 54 are connected to the respective rotary shafts of stepping motors 46, 48, whereas output signals from the encoders 52, 54 are fed into the controller 50 so as to carry out feedback control.

The controller 50 is responsible for the system control of the whole semiconductor manufacturing apparatus, and is basically constituted by an input section 56, an output section 58, a central processing unit 60, and a storage section 62. The stepping motors 46, 48 are connected to the output section 58 of the controller 50, whereas the rotary encoders 52, 54 are connected to the input section 56. Also connected to the input section 56 is an input device 64 such as a switch or keyboard for determining details of operations, instructions for starting/ending operations, and the like, whereas a monitor 66, an alarm 68, and the like are connected to the output section 58.

Figure 3:
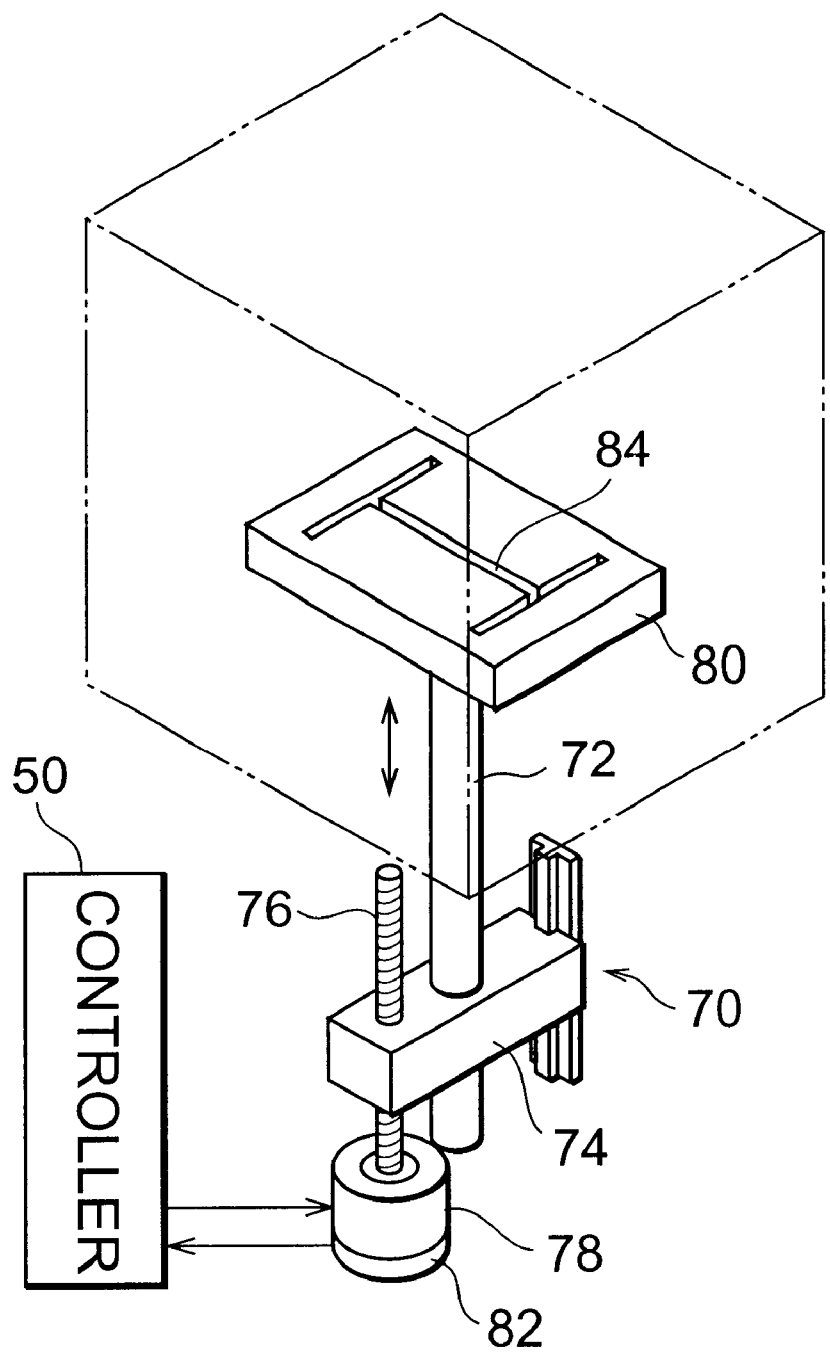
FIG. 3 is a perspective view schematically showing the configuration of a cassette indexer which is one of subjects to be inspected by the inspection apparatus of the present invention.

Also, as schematically shown in FIG. 3, a cassette indexer 70 for mounting the wafer cassette 18 (see FIG. 1) and moving it upland down is disposed within each of the load-lock chamber 14, 16. The cassette indexer 70 is mainly constituted by a vertically extending lift shaft 72; a feed screw 76 extending parallel to the lift shaft 72 so as to be threaded into a nut member 74 united with the lift shaft 72; a stepping motor 78 for rotating the feed screw 76; and a cassette stage, 80, firmly attached to the upper end of the lift shaft 72, for mounting the wafer cassette 18 thereon. When the stepping motor 78 is controlled so as to rotated the feed screw 76 in one of normal and reverse directions, the lift shaft 72 and cassette stage 80 move up or down. As a consequence, each wafer W within the wafer cassette 18 mounted on the cassette stage 80 can selectively be disposed at a transfer position, i.e., at a height position for transferring it to the blade 42 of the wafer transfer robot 26.

As with the stepping motors 46, 48 in the wafer transfer robot 26, the stepping motor 78 is connected to the output section 58 of the controller 50. Also, a rotary encoder 82 attached to the rotary shaft of the stepping motor 78.is connected to the input section 56 of the controller 50, whereby feedback control is carried out.

An H-shaped groove 84 for positioning the wafer cassette 18 is formed in the upper face of the cassette stage 80 such that an H-shaped protrusion (not shown) formed on the lower face of the wafer cassette 18 fits therein. Though not shown in detail, the wafer cassette 18 is well-known, in which inner faces of side plates opposing each other are formed with slots at predetermined intervals in the vertical direction, so that a single wafer W can be inserted into a pair of slots.

Figure 4:
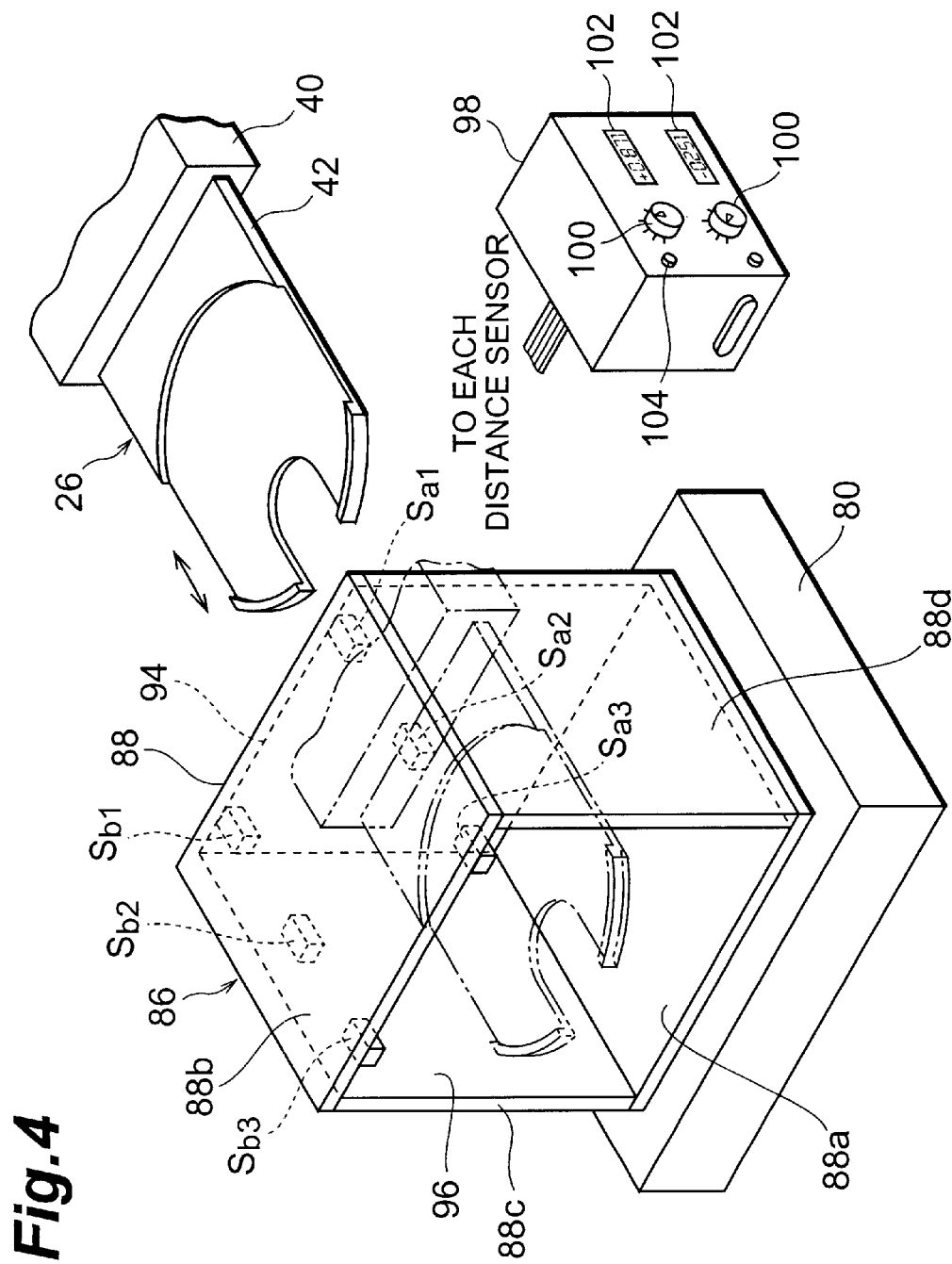
FIG. 4 is a perspective view showing an embodiment of the inspection apparatus in accordance with the present invention.
Figure 5:
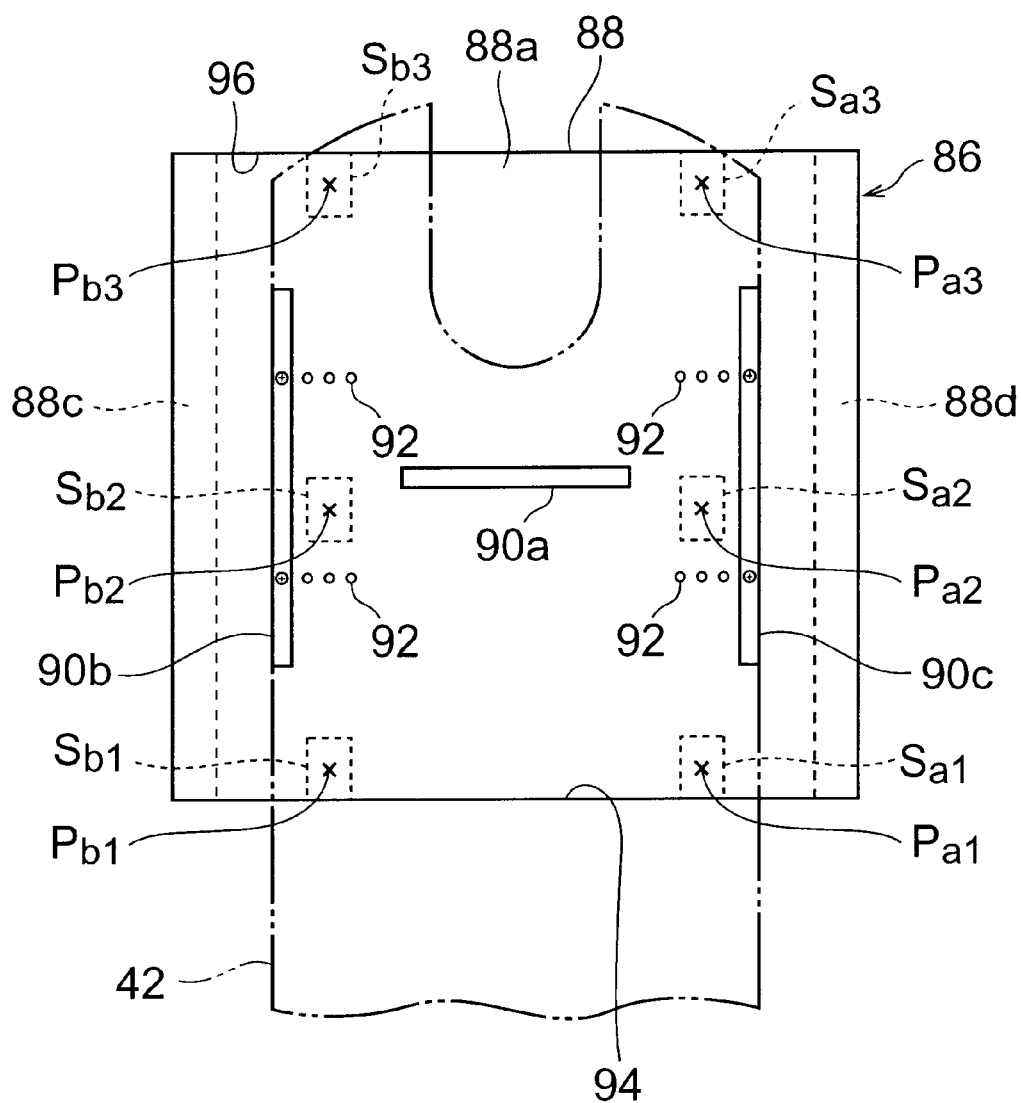
FIG. 5 is a bottom view of the inspection apparatus of FIG. 4.

An inspection apparatus 86 in accordance with the present invention for inspecting the wafer transfer robot 26 in the above mentioned semiconductor manufacturing apparatus is used while being set to the cassette stage 80 within the load-lock chambers 14, 16. FIG. 1 shows a state where the inspection apparatus 86 set within one load-lock chamber 14. As shown in FIGS. 4 and 5, the inspection apparatus 86 comprises a plurality of distance sensors S (suffixed with a1, a2, a3, b1, b2, and b3 for clarification when appropriate), and a holder 88 for holding these distance sensors S. The holder 88 comprises a lower plate 88a, an upper plate 88b disposed parallel to the lower plate 88a, and a pair of side plates 88c, 88d opposing each other and connecting the lower plate 88a and the upper plate 88b to each other, whereas the remaining pair of side face portions in the holder 88 are open.

The area and form of the lower face of the lower plate 88a approximate those of the lower face of the wafer cassette 18, so that the holder 88 can be mounted on the upper face of the cassette stage 80. When the holder 88 is mounted on the cassette stage 80, the upper face of the lower plate 88a is parallel to the upper face of the cassette stage 80. Preferably, the lower face of the lower plate 88a is formed with protrusions 90a to 90c fitting into the H-shaped groove 84 of the cassette stage 80 (see FIG. 5). Since the dimensions of the H-shaped groove 84 in the cassette stage 80 vary depending on the type of used semiconductor manufacturing apparatus, it is preferred that, as shown in FIG. 5, protrusions 90b, 90c be formed such that they can be bolted whereas the lower plate 88a is formed with a number of bolt holes 92 so as to be able to correspond to various kinds of H-shaped grooves 84.

When the holder 88 is disposed at a predetermined position in the upper face of the cassette stage 80, one opening 94 of the holder 88 directly faces the opening 24 with respect to the transfer chamber 12, whereas the other opening 96 directly faces the load-lock chamber door 20. Consequently, the-blade 42 can be inserted from the opening 94. Here, the openings 94, 96 will be referred to as front and rear openings, respectively.

The distance sensors S are attached to the lower face of the upper plate 88b of the holder 88. Each distance sensor S is of noncontact type, and measures the distance between the blade inserted into the holder 88 and the lower plate 88a of the holder 88. In this embodiment, each distance sensor S is of laser type and is attached to the holder upper plate 88b such that a laser beam emitted from a light-projecting device is made incident on the upper face of the holder lower plate 88a substantially at right angles.

Though the distance sensors S maybe disposed at various positions, they are preferably arranged such that locations $P_{a1}$ to $P_{a3}$ and $P_{b1}$ to $P_{b3}$, three by three in two rows, shown in FIG. 5 become measurement points. In the state where the holder 88 is set at the predetermined position on the cassette stage 80, respective lines connecting the measurement points $P_{a1}$ to $P_{a3}$ to each other and the measurement points $P_{b1}$ to $P_{b3}$ to each other are parallel to the blade advancing direction at the time of inserting the blade 42 of the wafer transfer robot 26 into the holder 88, and are arranged symmetrical to each other. On the other hand, respective lines connecting the measurement points $P_{a1}$ and $P_{b1}$ to each other, the measurement points $P_{a2}$ and $P_{b2}$ to each other, and the measurement points $P_{a3}$ and $P_{b3}$ to each other extend in a direction orthogonal to the blade advancing direction.

In the shown embodiment, the distance sensors S are connected to a control unit 98 prepared separately from the holder 88. The control unit 98 has sensor change over switches 100 for arbitrarily selecting two distance sensors from the six distance sensors S connected thereto, and can control the beam emission from the light-projecting devices of thus selected distance sensors S, process signals outputted from the light-receiving devices of these light-projecting devices S, cause digital indicators 102 to display the distance data obtained by the signal processing, and so forth. The distance is displayed with reference to the upper face of the holder lower plate 88a, whereby the distance between the upper face of the blade 42 crossing the laser beams from the selected distance sensors S and the upper face of the holder lower plate 88a is displayed. When the holder 88 is placed on the cassette stage 80, the upper face of the holder lower plate 88a and the upper face of the cassette stage 80 become parallel to each other, where by the above-mentioned distance is expressed with reference to the upper face of the cassette stage 80.

A method of inspecting the static and dynamic states. of the blade 42 in the wafer transfer robot 26 by using the above-mentioned inspection apparatus 26 will now be explained.

First, the load-lock door 20 of one load-lock chamber 14 is opened, and the holder 88 of the inspection apparatus 86 is mounted on the upper face of the cassette stage 80 and is positioned by fitting the protrusions 90a to 90c on the lower face of the holder 88 into the groove 84 on the cassette stage 80. Subsequently, the stepping motor 78 for driving the cassette indexer 70 is controlled so as to move the cassette stage 80 up and down and place it to a height at which the front opening 94 of the holder 88 is disposed in front of the opening 24 between the transfer chamber 12 and the load-lock chamber 14. This position is located where the blade 42 of the wafer transfer robot 26 does not come into contact with any of the constituents of the inspection apparatus 86 when inserted into the wafer transfer robot 26 as a matter of course.

Each distance sensor S is subjected to zero point adjustment thereafter or beforehand. This is an operation by which the distance data obtained without the insertion of the blade 42 is digitally displayed as "0 mm." Such zero point adjustment is important for dealing with the positional deviation of the distance sensor S, such as the positional deviation occurring when the distance sensor S is made removable from the holder 88 whereas its attaching position is changed as required as will be explained later in particular. The zero point adjustment can be effected when a reset switch 104 provided in the control unit 98 is pushed, for example.

After the zero point adjustment for the distance sensor S, the slit valve of the opening 24 is opened, and the stepping motors 46, 48 for driving the wafer transfer robot 26 are controlled by the controller 50, so as to rotate a pair of driving arms 32, 34 in the same direction, whereby the blade 42 directly faces the opening 24. Subsequently, the stepping motors 46, 48 are controlled such that the driving arms 32, 34 rotate so as to approach each other, whereby the blade 42 is inserted into the front opening 94 of the holder 88 from the transfer chamber 12 via the slit valve. The position 42 during this period is specified by the number of pulses in the pulse signals fed to the stepping motors 46, 48, and the pulse number is displayed on the monitor 66 connected to the controller 50.

After a predetermined number of pulses is fed to the stepping motor 46, 48 such that the left and right leading end parts of the blade 42 are disposed directly under the distance sensors $S_{a1}$, $S_{b1}$ on the holder front opening 94 side, the sensor changeover switches 100 of the control unit 98 are changed over such that the outputs from the distance sensors $S_{a1}$, $S_{b1}$ are displayed, and the values displayed on the digital indicators 102 are read out and recorded with the number of input pulses. Subsequently, a predetermined number of pulses are fed into the stepping motors 46, 48 so that the blade 42 linearly advances a little. When the blade 42 stops, the output values from the above-mentioned distance sensors $S_{a1}$, $S_{b1}$ and the number of input pulses are recorded again. These operations are repeated sequentially. Then, if the leading ends of the blade 42 are disposed directly below the distance sensors $S_{a2}$, $S_{b2}$ in the middle, then the sensor changeover switches 102 are operated such that the output values from the distance sensors $S_{a2}$, $S_{b2}$ in the middle can also be displayed and recorded. Subsequently, similar procedures are repeated. Finally, if the blade 42 is moved closest to the load-lock door 20 of the load-lock chamber 14 so as to be placed directly under the distance sensors $S_{a3}$, $S_{b3}$ on the holder rear opening 96 side, then the distance data from these distance sensors $S_{a3}$, $S_{b3}$ are also read out. This behavior of blade 42 can also be visually inspected by an operator from the rear opening 96 of the holder 88.

Figure 6:
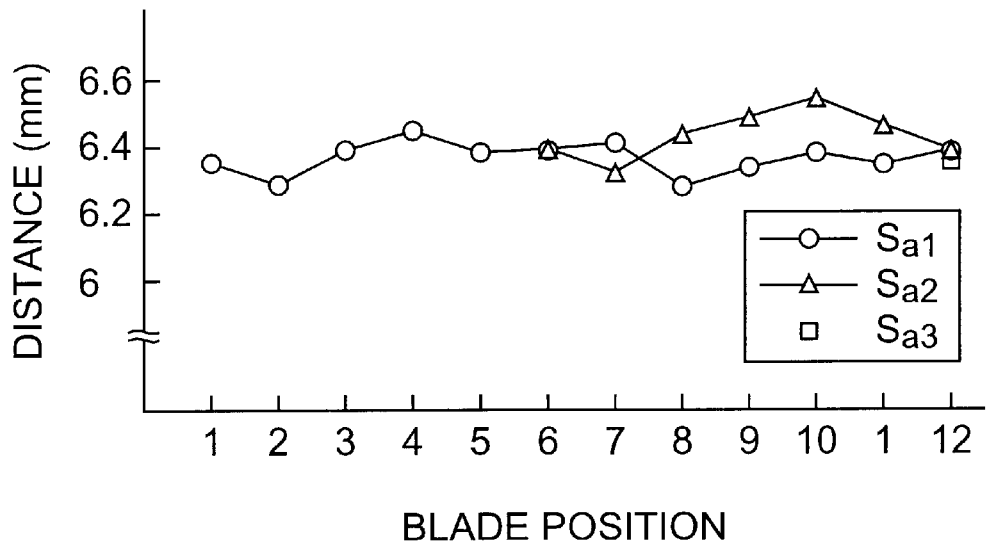
FIG. 6 is a graph showing the vertical movement of a blade according to data from distance sensors when the blade advances linearly.

For example, the following Table 1 shows distance data collected by use of the distance sensors $S_{a1}$ to $S_{a3}$ on one side while the inspection apparatus 86 is set with the blade 42 being moved intermittently in the load-lock chamber 14. FIG. 6 is a graph showing the locus of movement of the blade 42 based on Table 1.

TABLE 1

| Blade Position | Number of Pulse | Distance between Holder Lower Plate and Blade (mm) | | |
|---|---|---|---|---|
| | | $S_{a1}$ | $S_{a2}$ | $S_{a3}$ |
| 1 | 10770 | 6.35 | 0 | 0 |
| 2 | 11000 | 6.29 | 0 | 0 |
| 3 | 12000 | 6.40 | 0 | 0 |
| 4 | 13000 | 6.45 | 0 | 0 |
| 5 | 14000 | 6.39 | 0 | 0 |
| 6 | 15000 | 6.40 | 6.39 | 0 |
| 7 | 16000 | 6.42 | 6.33 | 0 |
| 8 | 17000 | 6.28 | 6.44 | 0 |
| 9 | 18000 | 6.34 | 6.48 | 0 |

TABLE 1-continued

| Blade Position | Number of Pulse | Distance between Holder Lower Plate and Blade (mm) | | |
|---|---|---|---|---|
| | | $S_{a1}$ | $S_{a2}$ | $S_{a3}$ |
| 10 | 19000 | 6.39 | 6.54 | 0 |
| 11 | 20000 | 6.35 | 6.46 | 0 |
| 12 | 20710 | 6.39 | 6.38 | 6.36 |

As can be seen from Table 1 and FIG. 6, the measured values are not linear. This is because of the fact that the blade 42 shakes in the vertical direction when moved horizontally. Depending on the magnitude or amplitude of shaking, certain measures such as maintenance of the wafer transfer robot 26, replacement of parts thereof, and the like are taken.

The difference between the respective measured values of distance sensors $S_{a1}$ and $S_{a3}$ at a pulse count of 20710 represents the degree of inclination of the blade 42 with respect to the upper face of holder lower plate 88a at the time when the blade 42 stands still. Since the upper face of the holder lower plate 88a is parallel to the upper face of the cassette stage 80, the above-mentioned difference is also the degree of inclination (parallelism) of the blade 42 with reference to the upper face of the cassette stage 80. If such a degree of inclination exceeds a permissible range, then it is necessary to carry out calibration, maintenance, replacement of parts, and the like in the wafer transfer robot 26 and the cassette stage 80 of the cassette indexer 70. Also, the state of warp or curvature of the blade 42 can be seen from the measured values of distance sensors $S_{a1}$ to $Sa_3$ at a pulse count of 20710.

Figure 7:
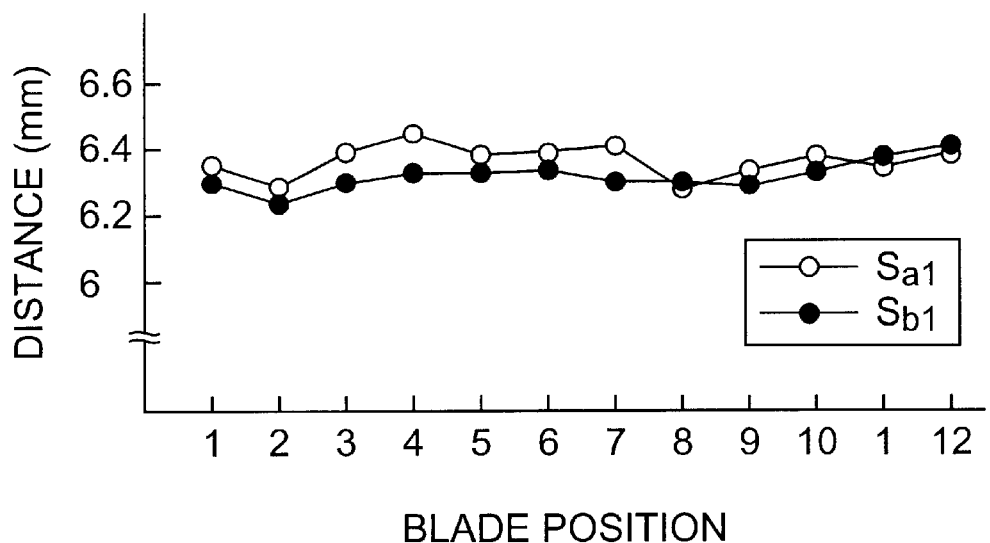
FIG. 7 is a graph showing the blade rolling according to data from individual distance sensors when the blade advances linearly.

The following Table 2 shows the distance data collected by the distance sensors $S_{a1}$, $S_{b1}$ on the holder front opening 94 side, whereas FIG. 7 is a graph showing the state of rolling of blade 42 according to Table 2.

TABLE 2

| Blade Position | Number of Pulse | Distance between Holder Lower Plate and Blade (mm) | |
|---|---|---|---|
| | | $S_{a1}$ | $S_{b1}$ |
| 1 | 10770 | 6.35 | 6.29 |
| 2 | 11000 | 6.29 | 6.24 |
| 3 | 12000 | 6.40 | 6.30 |
| 4 | 13000 | 6.45 | 6.32 |
| 5 | 14000 | 6.39 | 6.32 |
| 6 | 15000 | 6.40 | 6.34 |
| 7 | 16000 | 6.42 | 6.30 |
| 8 | 17000 | 6.28 | 6.31 |
| 9 | 18000 | 6.34 | 6.30 |
| 10 | 19000 | 6.39 | 6.33 |
| 11 | 20000 | 6.35 | 6.39 |
| 12 | 20710 | 6.39 | 6.40 |

From Table 2 and FIG. 7, it can be seen that sidewise rolling occurs as the blade 42 advances. Maintenance of the wafer transfer robot 26 and the like become necessary according to the magnitude or amplitude of rolling in this case as well. The difference between the measured values of distance sensors $S_{a1}$, $S_{b1}$ at each pulse count position indicates the angle of inclination of the blade 42 with respect to the upper face of the holder lower plate 88a, i.e., the upper face of the cassette stage 80. In this case, unlike the one mentioned above, the degree of inclination is defined in a direction orthogonal to the blade advancing direction. This difference also becomes a guide for determining the timing for calibration, maintenance, and the like.

If the inspection apparatus 86 is used when carrying out a calibration operation, an operation for replacing parts, or the like, then the degree of parallelism or inclination after the operation and the shaking and sagging of the blade can be verified accurately.

Preferably, the foregoing operation is carried out while the vertical position of the cassette stage 80 is appropriately changed as required. This is because of the fact that the soundness of cassette indexer 70 can be inspected thereby. The cassette indexer 70 within the other load-lock chamber 16 is similarly inspected by the inspection apparatus 86 set therein.

Though the operation in the above-mentioned embodiment is carried out such that the blade 42 is moved intermittently while the monitor 66 of the controller 50 for controlling the semiconductor manufacturing apparatus is being observed, the respective signals of the individual distance sensors S can be fed from the control unit 98 to the controller 50 as shown in FIG. 2, so that the state of blade 42 in the wafer transfer robot 26 is determined automatically in the controller 50. Namely, since the controller 50 manages pulse signals for operating the blade 42, it can automatically prepare the above-mentioned Tables 1 and 2 upon receiving respective distance data of the distance sensors S from the control unit 98, so as to obtain the degree of inclination of blade 42 and the magnitude of shaking and sagging and determine whether they fall within their permissible ranges or not. Also, it is unnecessary to intermittently operate the blade 42, and data can be collected in a substantially continuous manner, whereby the behavior of blade 42 can be measured quite accurately. The controller 50 can cause the monitor 66 to display results of determination and graphs similar to those of FIGS. 6 and 7 by using appropriate programs, so as to graphically represent the behavior of blade 42 in a three-dimensional manner. If an operation exceeding a permissible range is effected, then the alarm 68 can be actuated as well. Since whether or not the blade 42 is located at a position to be located when a certain number of pulses are provided can be determined from signals from the distance sensors S, the abnormality of stepping motors 46, 48, e.g., power swing, can be inspected as well.

Thus, the controller 50 can function as blade position detecting means for detecting the horizontal position of blade 42 and as determination means for determining the state of transfer robot 26 according to the distance data measured by distance sensors S and the positional data obtained by the blade position detecting means.

Though a preferred embodiment of the present invention is explained in detail in the foregoing, the present invention is not restricted to the above-mentioned embodiment as a matter of course. For example, though six distance sensors S are attached to the holder 88 in the above-mentioned embodiment, seven or more distance sensors S maybe provided, or only two or three of them may be used such that their positions are changed as appropriate. For example, the distance sensors $S_{a1}$, $S_{a2}$ are sufficient for inspecting the sagging of blade 42 alone, whereas the distance sensors $S_{a1}$, $S_{b1}$ are sufficient for inspecting the sidewise rolling thereof alone.

The method for displaying distance data obtained by the distance sensors S is not limited to the one using the digital displays 102, whereby data may be displayed onto an oscilloscope connected to the control unit 98 or onto a CRT of a personal computer. If a personal computer is used, then data concerning the pulse signals supplied from the controller 50 of the semiconductor manufacturing apparatus to the stepping motors 46, 48 can be fed into the personal computer, so as to cause the latter to perform graphic display and automatic determination as mentioned above.

Further, the present invention is applicable not only to wafer transfer robots in the semiconductor manufacturing apparatus, but also to any substrate transfer robot of a type transferring a substrate mounted on a blade. For example, it can also be employed for inspecting liquid crystal transfer robots in liquid crystal display manufacturing apparatus.

Furthermore, the holder 88 may have various forms other than the one shown in the above-mentioned embodiment. For example, it may be shaped like an inverted U without the lower plate 88*a*. Though the distance to the upper face of the holder lower plate 88*a* is measured, so that the degree of parallelism to the upper face of the cassette stage 80 and the like are indirectly measured, the degree of parallelism to the upper face of the cassette stage 80 and the like can be inspected directly if a holder shaped like an inverted U without the lower plate 88*a* is used.

Also, the reference surface for seeing the degree of parallelism of blade 42 and the like can be changed as appropriate according to the mode of substrate processing apparatus.

INDUSTRIAL APPLICABILITY

As explained in the foregoing, static and dynamic states of the blade in the substrate (wafer) transfer robot and, consequently, the soundness of apparatus can be inspected and grasped accurately in accordance with the present invention. Therefore, the calibration (parallelism adjustment) between the cassette indexer and robot blade, for example, can be carried out with a high accuracy. Also, no time is inutilely wasted for determining whether the maintenance for apparatus is necessary or not, so that the downtime of the apparatus can be minimized, which contributes to improving the operating ratio.

Hence, it also contributes to improving the efficiency in substrate processing for making semiconductors, and the like.

What is claimed is:

1. An inspection apparatus for inspecting a substrate transfer robot having a substantially horizontally movable blade on which a substrate is mounted, said inspection apparatus comprising a noncontact type distance sensor adapted to measure a vertical distance between a substantially horizontal reference surface and said blade moving above said reference surface.

2. An inspection apparatus for a substrate transfer robot according to claim 1, wherein said distance sensor is attached to a holder adapted to be mounted on said reference surface, said blade being let in and out of said holder.

3. An inspection apparatus for a substrate transfer robot according to claim 2, wherein said holder comprises a lower plate adapted to be mounted on said reference surface; an upper plate disposed parallel to said lower plate with a predetermined gap therebetween; and a pair of side plates, opposing each other, for connecting said upper and lower plates to each other, said distance sensor being attached to a lower face of said upper plate.

4. An inspection apparatus for a substrate transfer robot according to claim 1, wherein two or more said distance sensors are arranged in parallel along a predetermined locus in which said blade advances linearly.

5. An inspection apparatus for a substrate transfer robot according to claim 1, wherein three distance sensors are arranged in parallel in each of two rows along a predetermined locus in which said blade advances linearly.

6. An inspection apparatus for a substrate transfer robot according to claim 1, further comprising display means for displaying distance data measured by said distance sensor.

7. An inspection apparatus for a substrate transfer robot according to, claim 1, further comprising:

blade position detecting means for detecting a horizontal position of said blade; and determination means for determining a state of said substrate transfer robot according to distance data measured by said distance sensor and positional data obtained by said blade position detecting means.

8. An inspection apparatus for a substrate transfer robot according to claim 1, wherein said reference surface is a surface within a substrate processing apparatus for letting in and out said blade of said substrate transfer robot.

9. An inspection apparatus for a substrate transfer robot according to claim 8, wherein said substrate processing apparatus is a multi-chamber type semiconductor manufacturing apparatus comprising a transfer chamber in which said substrate transfer robot is disposed; a process chamber, connected to said transfer chamber, for processing a semiconductor wafer as said substrate; and a load-lock chamber connected to said transfer chamber and arranged with a wafer cassette for accommodating a plurality of semiconductor wafers, said reference surface being an upper face of a cassette stage of a cassette indexer disposed in said load-lock chamber.

* * * * *

UNITED STATES PATENT AND TRADEMARK OFFICE
CERTIFICATE OF CORRECTION

PATENT NO. : 6,401,554 B1
DATED : June 11, 2002
INVENTOR(S) : Kunihiko Mori et al.

It is certified that error appears in the above-identified patent and that said Letters Patent is hereby corrected as shown below:

<u>Title page,</u>
Primary Examiner, please change "Robot" to -- Robert --.

<u>Column 1,</u>
Line 17, please change "divices" to -- devices --.
Line 43, please change "formed-with" to -- formed with --.

<u>Column 4,</u>
Line 59, please change "upland" to -- up and --.

<u>Column 5,</u>
Line 10, please change "78.is" to -- 78 is --.

<u>Column 6,</u>
Line 38, please change "where by" to -- whereby --.

<u>Column 9,</u>
Line 54, please change "maybe" to -- may be --.

<u>Column 11,</u>
Line 5, please change "to.claim 1" to -- to claim 1 --.

Signed and Sealed this

Thirty-first Day of December, 2002

JAMES E. ROGAN
*Director of the United States Patent and Trademark Office*